United States Patent
Bonella et al.

(10) Patent No.: US 6,928,571 B1
(45) Date of Patent: Aug. 9, 2005

(54) DIGITAL SYSTEM OF ADJUSTING DELAYS ON CIRCUIT BOARDS

(75) Inventors: Randy M. Bonella, Portland, OR (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 586 days.

(21) Appl. No.: 09/662,054

(22) Filed: Sep. 15, 2000

(51) Int. Cl.⁷ .................................................. G06F 1/04
(52) U.S. Cl. ...................................... 713/401; 713/503
(58) Field of Search ............................... 713/400, 401, 713/503

(56) References Cited

U.S. PATENT DOCUMENTS

| | | | |
|---|---|---|---|
| 5,615,358 A | | 3/1997 | Vogley |
| 5,646,904 A | * | 7/1997 | Ohno et al. .................. 365/233 |
| 5,675,832 A | | 10/1997 | Ikami et al. |
| 5,778,214 A | * | 7/1998 | Taya et al. ................... 713/400 |
| 6,041,419 A | * | 3/2000 | Huang et al. ................ 713/401 |
| 6,105,144 A | | 8/2000 | Wu |
| 6,154,821 A | * | 11/2000 | Barth et al. .................. 711/170 |
| 6,292,903 B1 | * | 9/2001 | Coteus et al. ................ 713/401 |
| 6,430,696 B1 | * | 8/2002 | Keeth .......................... 713/503 |
| 6,629,222 B1 | * | 9/2003 | Jeddeloh ...................... 711/167 |

FOREIGN PATENT DOCUMENTS

| | | |
|---|---|---|
| DE | 273732 A1 | 11/1989 |
| EP | 0556579 A1 | 8/1993 |
| EP | 1035478 A2 | 9/2000 |
| WO | WO 00/54164 | 9/2000 |

OTHER PUBLICATIONS

Scott Mueller, Upgrading and Repairing PCs, second edition, Que, 1992, pp. 835–841.*

* cited by examiner

*Primary Examiner*—Dennis M. Butler
(74) *Attorney, Agent, or Firm*—Fish & Richardson P.C.

(57) ABSTRACT

Technique and system for adjusting delays between signals. A number of signals are produced, and delays between the signals are determined. Programmable delay elements are used, each driven by a signal indicative of one of the delays. By delaying each of a number of the signals by different amounts, the signals can be caused to arrive at desired times, e.g., in synchronism with one another.

35 Claims, 3 Drawing Sheets

DIGITAL SYSTEM OF ADJUSTING DELAYS ON CIRCUIT BOARDS

BACKGROUND

Lengths of lines on a computer circuit board may affect the signals passing through the system. For example, system buses often run a number of lines in parallel. The lengths of the lines, however, may cause a delay between the times when the signals arrive.

In order to minimize the length induced delay between the different elements of the bus, layout considerations have been used. For example, trial and error techniques may be used to fine tune the signal paths, to allow signals to arrive in synchronism.

Extra lengths, such as serpentines, may be added at different areas on the layout.

DETAILED DESCRIPTION

The present invention teaches a system which addresses levelization. This system finds application in, for example, computer systems, such as memory interconnects, front side bus interconnect, graphics devices, I/O interconnects, and any other device which uses multiple bit interconnections.

A hardware solution is described which produces specified types of programmable delays in such a system. The hardware solution can include a register which sets the desired delay on each of the plurality of lines.

Figure 1:
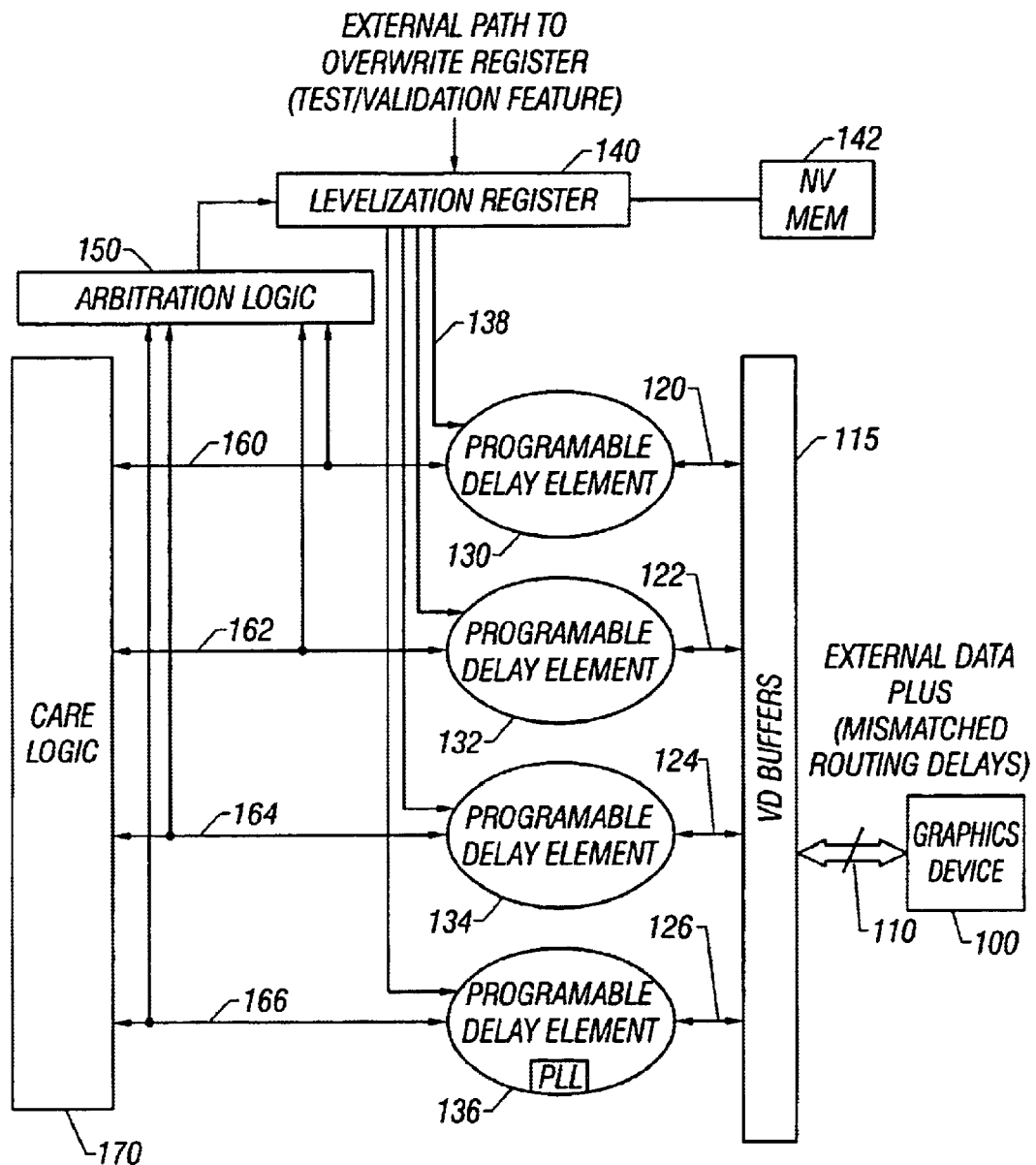
FIG. 1 shows a hardware implementation for levelization.

A first embodiment is shown in FIG. 1. An element 100 produces a number of outputs shown as bus 110. The bus 110 can include a plurality of lines, which may or may not have mismatch routing delays. These lines are buffered by I/O buffers 115. Each of the lines 120, 122, 124, 126 is shown in FIG. 1. While only four lines are shown in FIG. 1, it should be understood that the bus may have many more lines. For example, buses often have 8, 16 or 32 or more lines.

Programmable delay elements 130, 132, 134, 136 are provided on the lines. In this embodiment, there is a single delay element for each line, however, one or more of the lines may be configured without the delay element. Each delay element is controlled by a respective control line 138. In addition, there can be multiple delay lines for each line.

The signals 120, 122, 124, 126 are delayed by the respective delay elements to form (delayed) output signals 160, 162, 164, 166. These signals are coupled to the core logic 170, which can be circuitry that depends on the function of the device, e.g., memory, graphics, motherboard chipsets or other applications described herein.

A levelization register 140 stores a plurality of values. It can store a single different value for each of the delay elements 130–136. These delay values can delay the signals by specified amounts; e.g., by amounts which cause the signals to arrive substantially simultaneously, or within predetermined times of one another.

Arbitration logic 150 carries out the determination of values to be stored in the levelization register. Arbitration logic 150 can be coupled to the output lines 160, 162, 164, 166. The arbitration logic 150 reviews the signals 160 through 166, and determines desired timing information. For example, the arbitration logic 150 may determine whether adjacent lines are leading or trailing each other. Based on this determination, the settings for delay elements 130–136 are determined. These settings cause the values on output lines 160, 162, 164, 166 to be delayed to a specified relationship, e.g., substantially synchronized, or specifically offset.

The information is stored in this levelization register 140. The values are used to delay, bidirectionally, the signals on the signal path.

Alternatively, the arbitration logic 150 can determine leading and lagging edges of signals, and can program those values in the levelization register.

The programmable delay elements 130–136 can be formed using any element which can delay a signal by a variable amount based on an applied signal. These can include a digital delay element, a phase locked loop (PLL) which has multiple taps, a digital locked loop (DLL), or other techniques such as current starving transistors to delay the propagation of the signal therethrough. Moreover, as described above, not each line needs a delay element, e.g., some of the output lines may not include delay elements. However, it may be preferred that each of those lines which includes the delay element includes its own separate delay line 138.

This system can be used in a number of different application s. One application of the present system is in high speed parallel interconnection, where the bus length may actually affect the way that the data arrives at the core logic. This can also be used in memory interconnects, front side bus interconnect, graphics, IO interconnects and the like.

As described above, the arbitration technique carried out by arbitration logic 150 determines the values that are stored in the levelization register 140, which in turn stores contents for leveling mismatch in the delay elements 130–136.

Different ways of carrying out the arbitration are disclosed herein.

In general, the arbitration in arbitration logic 150 need only be carried when there is a system event. A system event could include, for example, a change of components installed in the system, such as new memory and/or new cards installed or anything else that might change some issue associated with signal delay. Different kinds of events that should cause new arbitration can be defined. In a Windows™ system, the events can be stored in the system registry and can be triggered by the Plug and Play™ detecting system, for example.

A catastrophic system problem such as a crash, or the like can also cause a new arbitration to be carried out.

Figure 2:
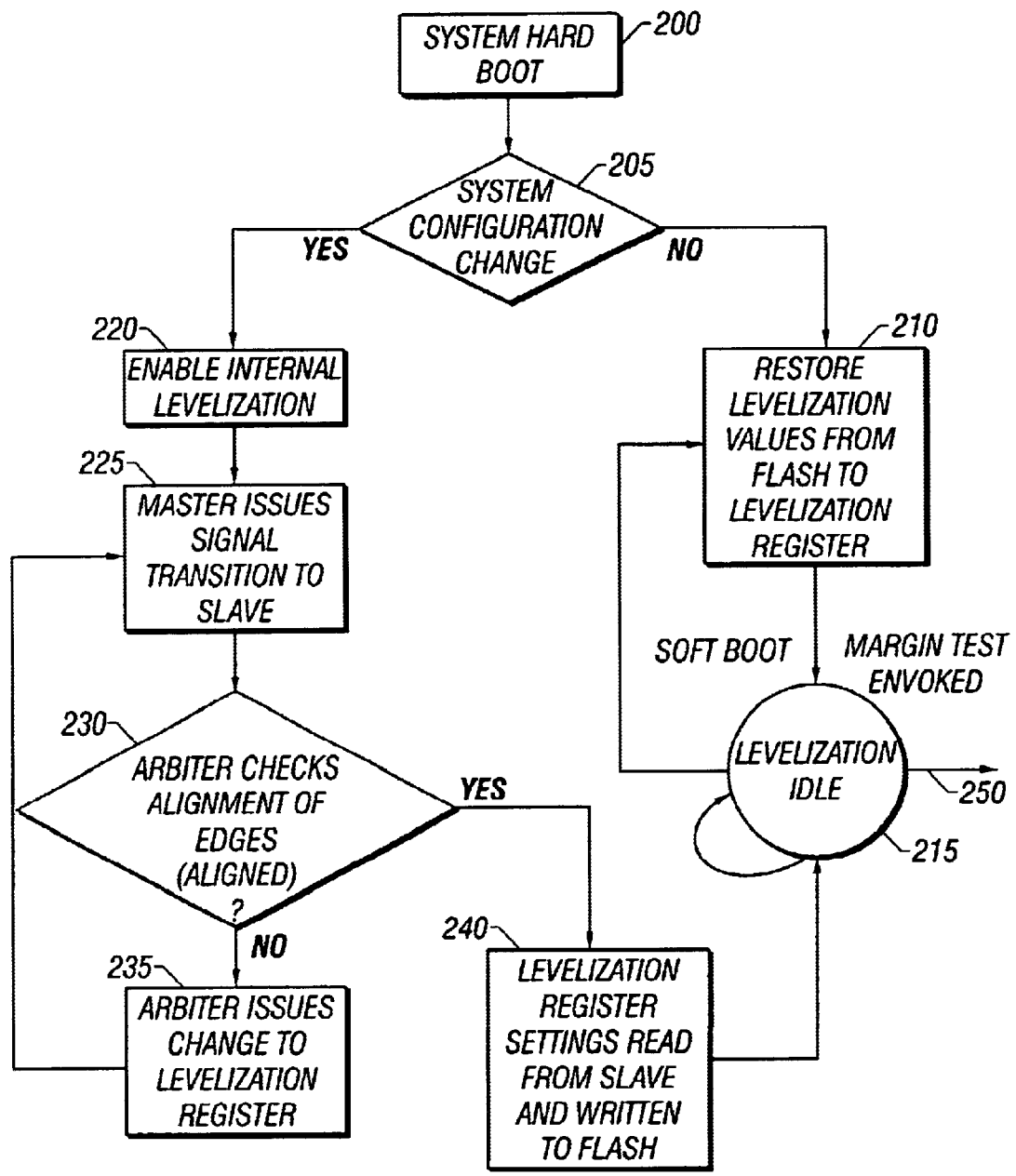
FIG. 2 shows a flowchart of levelization.

The flowchart in FIG. 2 shows the arbitration technique. It can be run by a processor, a microcontroller, or can be executed using dedicated hardwired logic, programmed into a field programmable gate array or into discrete circuitry using Hardware Design Language.

The system operates starting in a hard boot at 200 where a special flag is determined at 205. The flag indicates whether a system event of the defined type has occurred. If not, control passes to 210, where levelization values are restored from non volatile memory 142. The information is stored in the levelization register 140, and subsequently used for levelization of signals at 215.

If a system event has occurred at 205, then the system runs through a process of levelizing skews of the interconnects, beginning at 220. Interconnect skew levelization first comprises the master issuing a signal to the "slave" device 100, to cause signals to be produced on the external data bus 110. Each line is dithered by adding a certain amount of delay amount. When all signals arrive at the same time, or within a specified resolution of one another, then the current delays in the levelization register are taken as being the proper levelization delays. This is carried out physically by having checking the alignment of edges at 230. If the edges are not aligned at 235, the arbiter issues a change to levelization register to check the alignment using the next dither value. Flow returns to 225 where the master issues a signal to the slave to again produce signals to produce a new test.

When the edges are aligned at 230, then the current settings are taken as being proper, and the levelization register settings are read and stored in the non volatile memory 142.

A special margin test operation is shown as line 250. The margin test operation in more detail in FIG. 3. System timing margin is well-known in the art as being the level that is needed to set up and hold lines to the clock edge. However, in this system, programmable delays can be changed under user control. Because of these programmable delays, certain devices operate outside of the normal timing margins. This means that parts of the system are operating at a time that is delayed relative to the operation of other parts of the system.

Figure 3:
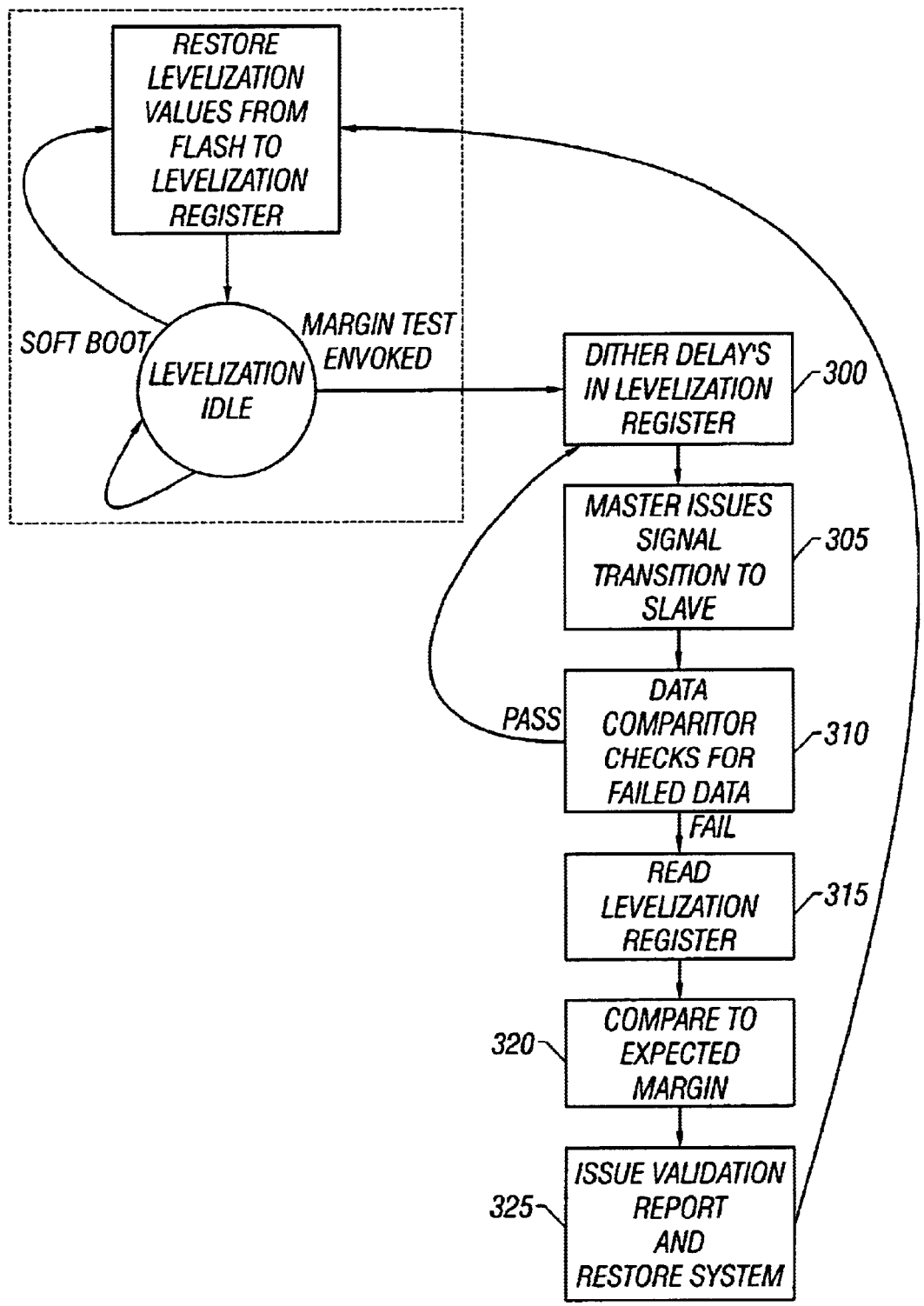
FIG. 3 shows a flowchart of clock skew operation.

System timing margin can be carried out in the system as shown in FIG. 3. Again, the delays in the levelization register 140 are dithered at 300. Each time a different dither occurs, the master issues a signal to the slave at 305, and a data comparator in the core logic 170 checks for failed data. If the system passes, then those values are taken as being usable, and the next value is used. Any failed values are read at 315, compared to the expected margin at 320, and used to form a report. The report 325 is used to set values for the levelization register. These values do not necessarily cause the signals to arrive simultaneously, but rather cause the signals to arrive in a way that allows some separated objects in the core logic to operate relative to one another, as desired. For example, certain parts may be delayed intentionally relative to other parts for some system timing reason.

Although only a few embodiments have been disclosed in detail above, other modifications are possible. For example, other programmable delay elements could be used.

What is claimed is:

1. A system, comprising:
   a data source, having a plurality of different lines;
   a plurality of programmable delay elements, each coupled to one of said plurality of lines, to control a delay in said one of said lines to produce delayed values;
   a register, storing values for said programmable delay elements which respectively control an amount of delay caused by said delay elements;
   an arbitration logic, coupled to said plurality of delayed values, and operating to determine relative timing of said plurality of lines, wherein said arbitration logic includes a first element which produces a set of first values for said register, and a second element which determines relative arrival of signals based on said first values, and wherein said arbitration logic dithers between different sets of values, and determines which of said plurality of values produces a best desired result, and stores said best result in said register, wherein said plurality of programmable delay elements thereafter are programmed with values in said register.

2. A system an in claim 1, wherein there are one of said programmable delay elements for each of said plurality of lines.

3. A system as in claim 1, wherein said register stores a plurality of values, each of said plurality of values controlling one of said programmable delay elements.

4. A system as in claim 3, further comprising a non volatile memory, storing said plurality of values.

5. A system as in claim 1, further comprising a graphics device, and wherein said signals are from said graphics device.

6. A system as in claim 1, further comprising a non-volatile memory, storing values for said delay elements, and loading said values into said register at a specified time.

7. A system as in claim 1, wherein said best result is one where the plurality of delayed signals are received at substantially the same time.

8. A system as in claim 1, wherein said best result is one where the plurality of delayed signals are received at a time skew that allows certain logic elements to operate correctly.

9. A system as in claim 1, further comprising a system event detector which produces a system event notification responsive to a specified event in the system; and
   wherein said arbitration logic operates to determine said values only responsive to said system event detector.

10. A system as in claim 9, wherein said system event is a change in hardware.

11. A method comprising:
    receiving a plurality of signals from an external device, each of said plurality of signals related to each other; and
    programmably delaying some of said signals relative to others of said signals according to prestored values; and
    determining if a system crash has occurred, and storing new delay values in a non volatile memory responsive to said system crash occurring.

12. A method as in claim 11, wherein plurality of signals are signals from a bus.

13. A method as in claim 12, wherein said plurality of signals are signals from a graphics bus.

14. A method as in claim 11, wherein said delaying comprises storing delay values in a non volatile memory; and
    using said values in said non volatile memory to adjust a value of a programmable delay element.

15. A method as in claim 14 wherein said system event is a change in system hardware configuration.

16. A method as in claim 14, wherein said system event is a system crash.

17. A method as in claim 14, wherein said reobtaining comprises dithering sets of values in a register that stores values for said programmable delay, determining results, and accepting a set of values which have produced a specified delay.

18. A method as in claim 17, further comprising storing said values in said non-volatile memory.

19. A method as in claim 17, wherein said specified delay is a result where there is a minimal delay between arrival of all signals.

20. A method as in claim 17, wherein said specified delay is a result where there is a specified delay between arrival of all signals which allows for clock skew in at least one specified logic element.

21. A method of equalizing time delays of signals, comprising:
    providing a plurality of signals which are produced in times that are synchronized with one another;

providing sets of values which represent different sets of delay values for said plurality of signals using one of said sets to delay each of said plurality of signals by a respective amount, wherein each of said respective amounts is different then each other respective amount for a different one of said signals based on said delay values;

testing said signals, to determine relative amounts of delays in said signals, to produce said delay amount;

repeating and using said testing to find a best one of said sets; and using said delay amounts from said best one of said sets to delay said signals.

22. A method as in claim 21, wherein said plurality of signals are signals from a graphics processing device.

23. A method as in claim 21, wherein said delaying comprises delaying each of the signals by respective amounts which causes them to arrive at a specified location at substantially similar times.

24. A method as in claim 23, wherein said delaying comprises delaying said signals by specified amounts which causes them to arrive at said location at specified times which are skewed relative to one another, wherein said skew is related to a clock margin of a system.

25. A method of setting delays in a system, comprising:

storing values indicative of time delays in a register, said time delays representing delays to be applied to signals to obtain a specified result;

detecting a system crash which indicates that said time delays should be changed;

when said system crash is not detected, using said values in said register to cause signal delays, by applying said values to respective programmable delay elements; and only when said system crash is detected, using a logic element to determine new delay values and applying said new delay values to said programmable delay elements to cause signal delays based on said new delay values.

26. A method as in claim 25, wherein said using a logic element comprises applying a plurality of delay values to a plurality of respective programmable delay elements to thereby delay a plurality of lines.

27. A method as in claim 25, further comprising storing said new delay values in a non-volatile memory.

28. A method as in claim 25, wherein said system crash is an operating system crash.

29. An electronic device, comprising:

a first device producing a plurality of first outputs;

a plurality of programmable delay elements, each of said plurality of programmable delay elements connected at one end to one of said plurality of outputs and each producing a second output which is delayed relative to said first outputs;

a levelization register, storing a plurality of values, said values each individually controlling one of said delay elements to control an amount of delay caused by said delay element to one of said plurality of outputs; and arbitration logic, connected to each of said second outputs, and determining a relative delay among said second outputs, and wherein said arbitration logic is responsive to a system event flag, which indicates a specified event in the system.

30. A device as in claim 29, wherein said specified event is a hardware change.

31. A device as in claim 29, wherein said specified event is a system crash.

32. A system as in claim 29, wherein said arbitration logic is responsive to said flag to produce a first multiple sets of values for said levelization register, command said first device to produce said signals for each of said sets of values, and determine a relative delay among said signals based on said first sets of values and stores a best set of values as levelization values.

33. A system as in claim 29, further comprising a non volatile memory which stores levelization values, said arbitration logic storing said levelization values in said non volatile memory.

34. A system as in claim 29, further comprising, at initial system start up, downloading values from said non volatile memory to said levelization register.

35. A system as in claim 29, wherein said programmable delay elements are phase locked loops.

\* \* \* \* \*